United States Patent [19]

Douglas

[11] Patent Number: 4,957,590
[45] Date of Patent: Sep. 18, 1990

[54] METHOD FOR FORMING LOCAL INTERCONNECTS USING SELECTIVE ANISOTROPY

[75] Inventor: Monte A. Douglas, Coppell, Tex.

[73] Assignee: Texas Instruments Incorporated, Dallas, Tex.

[21] Appl. No.: 402,944

[22] Filed: Sep. 5, 1989

Related U.S. Application Data

[63] Continuation-in-part of Ser. No. 273,287, Nov. 17, 1988, Pat. No. 4,863,559, which is a continuation of Ser. No. 159,282, Feb. 22, 1988, Pat. No. 4,793,896.

[51] Int. Cl.$^5$ .................. B44C 1/22; C03C 15/00; C03C 25/06; C23F 1/02
[52] U.S. Cl. .................... 156/643; 156/646; 156/662; 156/659.1; 204/192.35
[58] Field of Search .............. 156/643, 646, 652, 653, 156/655, 656, 657, 659.1, 662, 667; 204/192.32, 192.35, 192.37; 357/23.1, 65, 67; 437/180, 200, 228; 252/79.1

[56] References Cited

U.S. PATENT DOCUMENTS

| | | | |
|---|---|---|---|
| 4,574,177 | 3/1986 | Wang | 219/121 PE |
| 4,657,628 | 4/1987 | Holloway et al. | 156/643 |
| 4,676,866 | 6/1987 | Tang et al. | 156/643 |
| 4,690,730 | 9/1987 | Tang et al. | 156/643 |
| 4,784,973 | 11/1988 | Stevens et al. | 437/200 |
| 4,793,896 | 12/1988 | Douglas | 156/643 |

OTHER PUBLICATIONS

Chow et al., "Plasma Etching of Refractory Gates for VLSI Applications", *J. Electrochem. Soc.: Solid-State Science and Technol.*, vol. 131, No. 10, 1984, pp. 2325–2335.

Donnelly et al., "Anisotropic Etching in Chlorine-Containing Plasmas", *Solid-State Techol.*, vol. 24, No. 4, 1981, pp. 161–166.

Shah, "Refractory Metal Gate Processes for VLSI Applications", *IEEE Trans. on Electron Devices*, vol. ED-26, No. 4, Apr. 1979, pp. 631–640.

*Primary Examiner*—William A. Powell
*Attorney, Agent, or Firm*—Rodney M. Anderson

[57] ABSTRACT

A method for etching titanium nitride local interconnects is disclosed. A layer of titaniun nitride is either formed as a by-product of the formation of titanium silicide by direct reaction or by deposition. The location of the interconnects is defined by patterning photoresist at the desired locations. A plasma etch using a chlorine-bearing agent such as $CCl_4$ as the etchant etches the titanium nitride anisotropically at those locations covered by photoresist, and isotropically elsewhere, so that filaments of the titanium nitride are removed without undercutting the photoresist mask. The etch is selective relative to the underlying material, such as a refractory metal silicide, refractory metals, or silicon, due to the passivation of the underlying material by the carbon atoms of the $CCl_4$. The selectivity, together with the selective anisotropy, even allows significant overetch of the material to remove the filaments without undercutting the masked interconnect material.

29 Claims, 4 Drawing Sheets

METHOD FOR FORMING LOCAL INTERCONNECTS USING SELECTIVE ANISOTROPY

This application is a continuation-in-part of application S.N. 273,287 filed Nov. 17, 1988, now U.S. Pat. No. 4,863,559, which is a continuation of application S.N. 159,282 filed Feb. 22, 1988, now U.S. Pat. No. 4,793,896 issued Dec. 27, 1988.

This invention relates in general to semiconductor devices, and in particular to an improved method for forming local interconnects using chlorine bearing agents.

BACKGROUND OF THE INVENTION

Increasing the number of levels of interconnects (both intra-level and inter-level) in integrated circuits provides additional routing capability, more compact layouts, better circuit performance and greater use of circuit design within a given integrated circuit surface area. A particularly useful level of connection is commonly called local interconnection, where neighboring diffused areas are connected to one another, and to neighboring polysilicon and metal lines.

For example, a conventional method for creating local interconnects uses metal interconnection of diffused regions to one another, as well as to other layers. The metal interconnection is formed by etching vias through a thick oxide layer to the locations to be interconnected. A conductor is then formed to fill the vias and make the connection. This method is limited, for purposes of reducing the area required for such connection, by the state of the technology of etching contact holes and the planarization of interlevel dielectrics. These limitations include the alignment tolerance of the vias to the underlying region to be connected, the size of the via required (and accordingly the size of the contact area in the underlying region) which can be reliably etched, and the step coverage of the conductor in filling the via and making good ohmic contact to the underlying region. Also, the additional layer of a metallic conductor across the dielectric contributes to a loss of planarization in subsequent levels.

An alternative method developed by Hewlett Packard and published at page 118 of the 1984 IEDM Proceedings uses additional patterned silicon to provide conductive silicide regions extending over the field oxide as desired. A layer of titanium is deposited over the substrate and, prior to the direct reaction of the titanium with the underlying silicon to form the silicide, a thin layer of silicon is patterned on top of the titanium metal to define an interconnect extending over a silicon dioxide region separating the two regions to be interconnected. Where this silicon layer remains, a silicide is formed during the reaction process extending over the oxides. This method requires the deposition and patterning of the additional layer of silicon to define the local interconnection. In addition, the resulting silicide strap provides a conduit through which typical n-type dopants such as phosphorous can diffuse, since titanium silicide is a very poor diffusion barrier to conventional semiconductor dopants. If a silicide strap is used to connect n-type regions to p-type regions, for example n-doped polysilicon to p-type diffusion, subsequent processing must be done at relatively low temperatures to minimize the counterdoping of the p-type region with the n-type dopant through the silicide interconnect.

Another known method uses molybdenum metal as a local interconnect material. Molybdenum, however, also acts as a diffusion conduit through which phosphorus, used to dope n-type regions of the semiconductor device, can diffuse. The molybdenum interconnect therefore is not an effective local interconnect between n-type and p-type regions, as the p-type regions can be undesirably counterdoped by the phosphorous diffusing through the molybdenum, similarly as the silicide strap interconnect.

Another local interconnection method is disclosed in U.S. Pat. No. 4,675,073, issued to me on June 23, 1987, and assigned to Texas Instruments Incorporated, incorporated herein by this reference. As disclosed therein, the desired local interconnect is formed by patterning the residual titanium compound, for example titanium nitride, from the direct reaction forming titanium silicide cladding of the diffusions and polysilicon gates. The titanium nitride is sufficiently conductive so that it is useful to make local interconnections between neighboring regions. The disclosed process uses carbon tetrafluoride ($CF_4$) as the reactant in a plasma etch to remove the undesired titanium nitride faster than titanium silicide. This plasma etch using carbon tetrafluoride etches titanium nitride or titanium oxide at approximately twice the rate it removes titanium silicide. This technique also etches silicon oxides at twice the rate, and photoresist at five times the rate, as it etches titanium nitride or titanium oxide. Additionally, products of the etching process include solids that tend to adhere to the etching device. This requires extra maintenance and cleanup time that is nonproductive. Thus, a need has arisen for a method for producing a local interconnect with increased selectivity to the refractory metal compound of the local interconnect (e.g., titanium nitride or titanium oxide) relative to silicides, silicon oxides and photoresist, so that an additional layer of interconnection may be more consistently manufactured with precisely located interconnects and improved planarization compatible with sub-micron technology.

For purposes of forming such small feature sizes for the interconnect, it is well known that etches which are substantially anisotropic (i.e., directional) are preferred. Anisotropic etches provide improved control in fabrication, since the patterned masking material more closely defines the feature to remain after the etch; etches which are more isotropic tend, of course, to undercut the mask, requiring that the size of the patterned masking material be made larger than that of the desired feature in order to compensate for the line width loss resulting from the undercut.

However, substantially anisotropic etches can leave filaments of the material being etched. Such filaments tend to occur at locations where the etched material makes a step over surface topography. In the case of the local interconnect discussed above, such filaments can create a short circuit between conductive structures at the top of, and at the bottom of, a step where no such connection is desired. In addition, filaments may be present laterally, connecting two otherwise unconnected structures.

It should also be noted that the titanium nitride may be used as a gate material, especially in the case where it is deposited. Similar problems concerning the etch as described above will also affect the etch of such titanium gate electrodes, as well as other structures for which a conductive titanium compound may be used.

It is therefore an object of this invention to provide an etch for the residual material over insulating layers remaining from the direct react silicidation which is anisotropic at the locations where the masking layer is in place to define the interconnect, but which is isotropic elsewhere so that filaments of the interconnect material are removed.

It is a further object of this invention to provide such an etch which also has improved etch selectivity (i.e., an increased etch rate ratio) of the interconnect relative to underlying conducting layers.

It is a further object of the present invention to provide such an etch with improved selectivity to titanium nitride or titanium oxide with respect to titanium silicide, silicon dioxide and photoresist.

It is a further object of the present invention to provide such an etch which reduces the preventative maintenance and cleanup schedules and procedures by the use of a chlorine bearing agent as opposed to a flourine agent.

Other objects and advantages of the invention will become apparent to those of ordinary skill in the art having reference to the following specification in conjunction with the drawings.

SUMMARY OF THE INVENTION

The invention may be incorporated into a method for forming a local interconnect on a semiconductor surface. A dielectric layer of a prefabricated integrated circuit is covered with a conductive chemical compound of a refractory metal, such as titanium. The compound may be formed by deposition, or as a by-product of the silicidation of the refractory metal at locations where it is in contact with the underlying semiconductor. Photoresist is placed over this chemical compound layer to protect a specific portion thereof which will serve as an interconnect. A chlorine bearing agent is used to etch the exposed conductive chemical compound layer, which occurs in substantially an anisotropic manner at those locations where the photoresist is in place. At those locations where the photoresist is absent, the etch is substantially isotropic. Accordingly, the etch removes filaments which may otherwise remain upon clearing of the surfaces, without undercutting the photoresist mask. The chlorine bearing agent etches the conductive chemical compound at a greater rate than the underlying silicide, or other material used as a conductor.

BRIEF DESCRIPTION OF THE DRAWINGS

For a more complete understanding of the present invention, and for further advantages thereof, reference is now made to the following description taken in conjunction with the accompanying drawings in which.

DETAILED DESCRIPTION OF THE PREFERRED EMBODIMENTS

Figure 1:
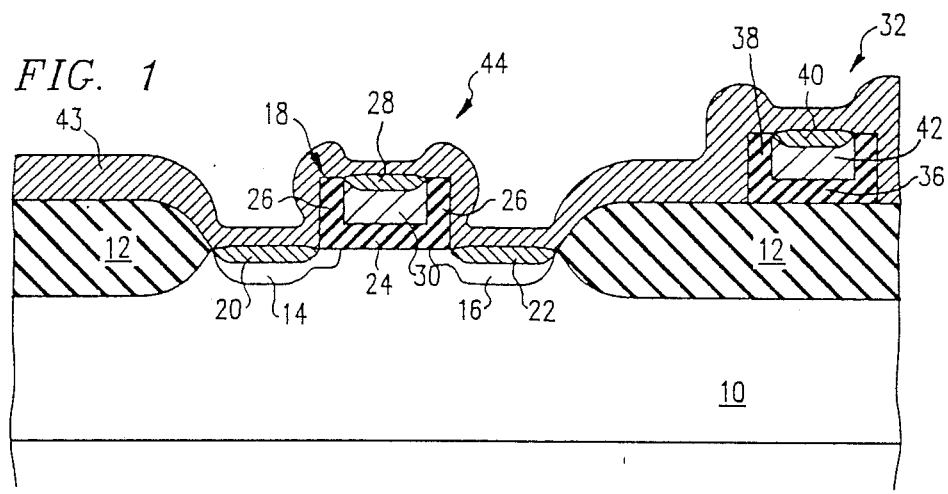
FIG. 1 is a cross-sectional view of a partially fabricated integrated circuit with a titanium chemical compound formed over the entire surface.

FIG. 1 shows the first step utilizing the method of the preferred embodiment of the present invention, as directed to an integrated circuit wafer 44. Wafer 44 contains a semiconducting substrate 10 formed of silicon. Field oxide 12, preferably silicon dioxide ($SiO_2$), is grown or deposited in selected portions of the surface of the substrate 10 for isolation of active regions from one another according to the well known local oxidation (LOCOS) isolation technique; of course, other isolation techniques such as trench isolation may alternatively be used. The active transistors of the integrated circuit device are formed into the locations of the surface of substrate 10 not covered with field oxide 12, such locations commonly called moat regions. In FIG. 1, a transistor 44 is shown having source and drain regions 14 and 16, respectively, diffused into the moat region between two portions of field oxide 12. Source and drain regions 14 and 16 are generally implanted and subsequently diffused after the placement of polysilicon gate electrode 30 over gate dielectric 24, so that source and drain regions 14 and 16 are self-aligned relative to gate electrode 30. As described in U.S. Pat. No. 4,356,623, issued Nov. 11, 1982 and assigned to Texas Instruments Incorporated, the incorporation of sidewall oxide filaments 26 along the side of gate electrode 30 provide for a graded junction, as shown in FIG. 1. FIG. 1 further illustrates a polysilicon layer 42 overlying field oxide 12 serving as an interconnect to another portion of the integrated circuit, for example extending to another moat region (not shown) and serving as the gate electrode for a transistor.

In this embodiment of the invention, source and drain regions 14 and 16, and gate electrodes 30 and 42, are clad with a refractory metal silicide such as titanium silicide. This cladding is performed by depositing a layer of the refractory metal, and subsequently heating the wafer 44 so that the metal directly reacts with the underlying silicon to form the silicide, as described in U.S. Pat. No. 4,384,301, issued on May 17, 1983 and assigned to Texas Instruments Incorporated. An example of the conditions for such direct reaction is heating the wafer 44 in a nitrogen and argon ambient at a temperature on the order of 675° C. Other methods of achieving the direct reaction may alternatively be used, for example, by use of a single-wafer Rapid Thermal Processor (RTP) where the wafer 44 is rapidly heated to the appropriate temperature for a sufficient amount of time to perform the direct reaction described above. It has been determined by physical analysis that the titanium silicide formed in this manner may not be stoichiometrically, or chemically, pure titanium silicide, but that measurable amounts of other materials such as silicon oxide and other oxides are also present in the film.

As described in said U.S. Pat. No. 4,675,073, where titanium is used as the refractory metal, as a result of the direct reaction process a layer of a conductive titanium compound covers the surface of the wafer 44, including the silicide regions. Referring to FIG. 1, source region 14, drain region 16, and gate electrodes 28 and 42 are shown clad with titanium silicide film 20, 22, 28 and 40, respectively. A layer 43 of residual material containing, for example, titanium nitride if the direct reaction is performed in a nitrogen atmosphere, remains over the surface; if a layer of oxide (not shown) is provided over the top of the titanium metal layer prior to the direct reaction, as described in U.S. Pat. No. 4,690,730 issued Sept. 1, 1987 and assigned to Texas Instruments Incorporated, layer 43 may contain titanium oxide. When formed in the nitrogen atmosphere, in the event that oxygen is present (at contamination-level concentration) in the titanium metal or in the atmosphere, or from the underlying silicon dioxide, layer 43 may also include titanium oxide, for example in the form of titanium oxynitride ($TiO_xN_y$).

Layer 43 will have a thickness on the order of 100 nm over field oxide 12, and will be thinner (e.g., on the order of 40 nm thick) in the locations over silicide film 20, 22, 28 and 40 cladding the underlying silicon or polysilicon. If desired, the thickness of layer 43 may be increased by a second deposition of titanium metal after the initial direct reaction, followed by a second direct reaction in a nitrogen atmosphere, as described in U.S. Pat. No. 4,676,866 issued June 30, 1987 and assigned to Texas Instruments Incorporated.

It should further be noted that the instant invention is also applicable to other structures, as well as to similar interconnection structures formed in a different manner. For example, layer 43 may alternatively be formed by way of deposition, for example by chemical vapor deposition or by sputtering of titanium nitride. If layer 43 is deposited, it should be noted that the structure may not necessarily include a silicide cladding on the surfaces of the source/drain regions 14 and 16, or on the gate electrode 30. However, for such a structure the etch process described herein is also beneficial for the selective etching of the interconnect layer 43.

Figure 2:
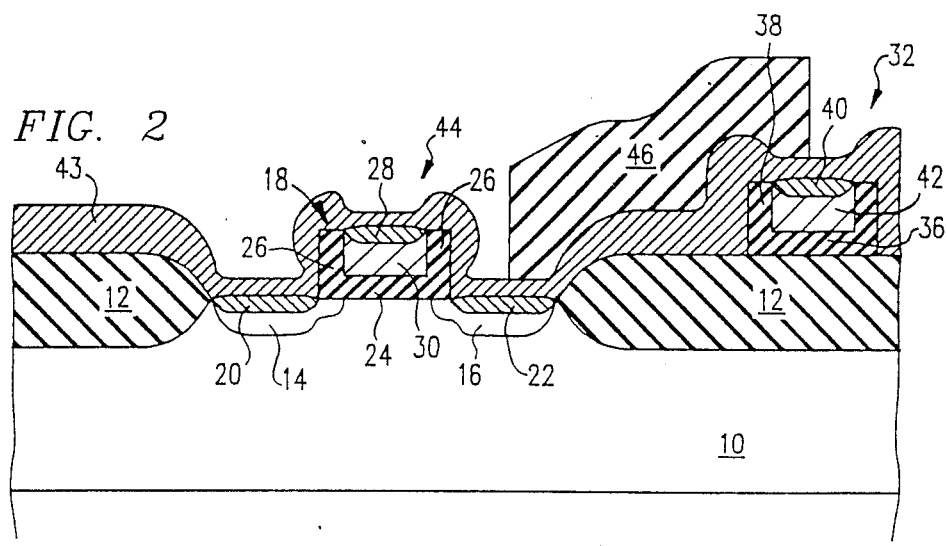
FIG. 2 is a cross-sectional view of the device of FIG. 1 with patterned masking material added over the area to be protected.

Referring to FIG. 2, the next step in the preferred embodiment of the present invention is illustrated. A layer of masking material is deposited over layer 43, and is patterned according to conventional techniques to remain in the locations of the eventual local interconnect, as shown by patterned masking material 46 in FIG. 2. The masking material 46 serves to protect the covered portion of layer 43 from subsequent etching. The patterned masking material 46 may be photoresist, or a hardmask material such as silicon dioxide.

When photoresist serves as the masking material 46, it is preferable to clean the surface of wafer 44 prior to beginning the etching process, by use of an $O_2$ based resist descum to establish etch rate uniformity, to prevent extended etch initiation periods and to eliminate post-etch scumming problems or incomplete etching of layer 48. An $O_2$ descum time equal to the removal of approximately 400A of resist is sufficient. Wafer 44 is then hardbaked at 120° C. for approximately 60 minutes in an oven and then $O_2$ descummed again. It is necessary to redo the descum if more than a three hour delay is incurred after the descum before the local interconnect dry etch described below to avoid incomplete etching of the local interconnect. It should also be noted that the oxygen descum, if performed after hard bake, will remove the resist anisotropically.

After patterning masking material 46, wafer 44 is placed in any appropriate plasma etching device such as plasma mode etcher, a reactive ion etcher or a microwave after glow, which are well known in the art. In the preferred embodiment, a plasma mode etcher, not shown, utilized. The plasma mode etcher comprises a symmetrical parallel plate reactor, for example with the substrate grounded. The powered top plate comprises graphite or titanium, and the bottom plate may comprise bare aluminum. The plates are spaced approximately one centimeter apart, and approximately 200 watts of power is applied. Radio frequency (RF) energy is transmitted between the parallel plates by an RF generator. The powered electrode also serves as a gas dispersal source similar to a shower head. According to the invention, a chlorine bearing agent such as carbon tetrachloride ($CCl_4$) is used as the dry etch reactant in the plasma mode etcher. Wafer 44 is placed on the grounded plate which is spaced apart from the powered plate by approximately one centimeter. The preferred substrate temperature is on the order of 50° C.

Carbon tetrachloride is a particularly useful chlorine-bearing agent for this etch because it can exhibit low etch rates of photoresist and silicon dioxide. Carbon tetrachloride also has a carbon center which will serve to "poison" the titanium silicide first layers 20, 22, 28 and 40 once layer 43 of the titanium compound lying over them has been etched. This poisoning, or surface passivation, is due to carbon, probably in the form of a partially dissociated carbon tetrachloride molecule (such as $CCl_x$ where $x=1$, 2 or 3) reacting with either the titanium or the silicon in the titanium silicide film 20, 22, 28 and 40 to form silicon carbide or titanium carbide. Since silicon carbide and titanium carbide are both non-volatile, the reactive sites on the titanium silicide first layers 20, 22, 28 and 40 are effectively "tied up", consumed or covered, thus preventing reaction of layers 20, 22, 28 and 40 with the other reactive species in the etch, namely chlorine. If not passivated, the chlorine in the etch is capable of volatilization and etching of the titanium or the silicon in silicide film 20, 22, 28 and 40. Moreover, the surface passivation from the chlorocarbon reagents can be of such a magnitude that a polymer film is formed, so that the surface passivation is on a macroscopic scale rather than a molecular scale.

Conversely, the reactive carbon containing species will react with the nitrogen component of the titanium nitride in layer 43 to form CN or $CN_2$, each of which is volatile. If oxygen is present in layer 43, the reactive carbon containing species will react with the oxygen to form carbon monoxide, also volatile. The residual atomic chlorine radicals will react with the titanium component in the titanium nitride of layer 43 to form titanium chloride ($TiCl_x$ where $x=1-4$), which is also volatile. Thus, the titanium nitride of layer 43 which is not protected by patterned masking material 46 will be etched, while leaving the titanium silicide first layers 20, 22 28 and 40, field oxide 12, and patterned masking material 46.

This mechanism, where the carbon from the carbon tetrachloride builds a residue on the material which is not to be substantially etched, but which reacts with nitrogen in the titanium nitride film to form volatile cyanogen (and with oxygen to form volatile carbon monoxide), can apply to other underlying layers having the same property as the titanium silicide. These other underlying layers can be either insulating or conductive. Examples of conductive material which are believed to have the property of being unable to volatilize the carbon, and which therefore will have a residue buildup thereupon when the titanium nitride is etched with the carbon tetrachloride etch described above, include silicon, cobalt silicide, tungsten, molybdenum, among others.

In order to initiate the plasma, it is necessary to detach electrons from the chlorocarbon anions present in the plasma gas. Because neutral chlorocarbon species have high cross-sections for electron attachment, the reaction chamber tends to become depleted of free electrons, which are crucial to the ignition of the plasma by the mechanism of electron-impact ionization of other atomic and molecular species. Such electron-impact ionization is generally required to ignite the plasma once the avalanche condition is reached. As is well known in the art, the electron is an important charged species in plasma ignition since its low mass allows it to be sufficiently energized by an RF electric field to ionize a neutral species.

A useful method according to the invention for generating sufficient free electrons to ignite the $CCl_4$ plasma is to illuminate the reaction chamber with a light source, with the light having a wavelength in the range of 180 to 1200 nanometers. In the preferred embodiment, an intense emission in the ultraviolet end of the spectrum, such as from a mercury/argon light source, will photodetach electrons from anions in the plasma, such anions having a high cross-section for photoelectron detachment. Hence, the light source illumination effectively provides a sufficient free electron concentration by photodetachment from the anions, to permit facile plasma ignition. Alternative techniques for replenishing the free electron concentration for otherwise detaching electrons, by introducing new electrons from an auxiliary source or by temporarily increasing the power of operation to increase the electron energy of a deficient concentration of electrons, can also be used for facilitating ignition.

Once the ignition begins, a plasma is formed resulting in electron-impact dissociation of $CCl_x$ where $x=1-3$, and atomic chlorine radicals. It is also advantageous to add an inert gas, such as helium (He), argon (Ar) or nitrogen ($N_2$) to the carbon tetrachloride to add stability to the plasma and also to improve the etch properties.

Molecular and atomic chlorine each can react with titanium or silicon to form volatile gases. The presence of excess chlorine can thus undesirably etch titanium silicide film 20, 22, 28, and 40. Hence, in addition to passivating the surface of silicide film 20, 22, 28 and 40 as described above with the carbon from the $CCl_4$ etchant, it is also desirable to reduce the chlorine concentration in the reaction chamber, further improving the titanium nitride to titanium silicide etch rate ratio. This can be accomplished by adding chlorine scavenging reagents to the carbon tetrachloride. Chlorine scavenging reagents are reagents that react with atomic or molecular chlorine to form a relatively inert or unreactive product, thereby reducing the amount of excess chlorine in the chamber, in turn reducing the undesired etching of titanium or silicon in the titanium silicide film 20, 22, 28 and 40.

One method for providing such a scavenging reagent is the use of a consumable powered electrode, such as one made from graphite or titanium, in the plasma mode etcher. Chlorine is quite reactive with this type of electrode material, depleting the chlorine concentration in the plasma. Another method that can be utilized is to add a reagent such as chloroform ($CHCl_3$), ammonia ($NH_3$), or cyanogen ($(CN)_2$) to the carbon tetrachloride. These reagents will dissociate in the plasma mode etcher, and combine with the excess chlorine to form either products which are inert to the silicide film, or which assist the passivation of the silicide film. In the example where chloroform is introduced as a chlorine scavenger, the dissociation of the chloroform liberates hydrogen which will scavenge for chlorine to form hyrochloric acid (HCl) which is not only inert to titanium silicide but is also volatile and easily removed from the reaction chamber. The other product of the scavenging provided by chloroform, namely $CCl_3$, enhances passivation of the titanium silicide surface and participates in etching the titanium nitride in the same manner as the $CCl_4$ etchant gas. If further dry etching is required, a second $O_2$ based resist descum is preferably performed prior to an additional plasma etch step. It should further be noted that hydrogen, for example from the dissociated chloroform, is also believed to lower the threshold for chlorocarbon polymerization, which will further enhance the selectivity of the etch.

However, on surfaces parallel to the ion flux, such as along the sides of sidewall filaments 26, the chlorine bearing agent may leave an interfacial film that resulted from a reaction between the dielectric ($SiO_2$) and the titanium. The plasma etch eradicates the interfacial film on surfaces disposed normal to the ion flux. Since the interfacial film is conductive, it can cause electrical shorts, such as between gate electrode 30 and source and drain regions 14 and 16, respectively. This interfacial film, of unknown composition but believed to be $TiSi_xO_y$, can be removed by a wet etch process.

This wet etch process comprises placing wafer 44 in a diluted solution of, for example, RCA ($NH_4OH + H_2O_2 + H_2O$) in a megasonic agitated tank, i.e., a tank agitated at a frequency greater than 500 kHz. The RCA solution is diluted with approximately six times more $H_2O$ than is normally used in a typical wet etch process for etching silicon. The megasonic tank, not shown, is commercially available with a bottom mount transducer. The bottom mount transducer megasonic tank should be of the type that translates the wafers in a cassette holder back-and-forth across a narrow transducer strip smaller than the wafer diameter. Wafer translation prevents localized heating of the wafer due to standing waves which contributes to early or rapid photoresist delamination. This is in contrast to a bottom-mount megasonic tank in which the entire bottom is a transducer and wafer translation is not part of the procedure. Wafer 44 is placed in the tank for approximately ten minutes which will remove the interfacial film without removing the titanium silicide film 20, 22, 28 and 40 or delaminating photoresist, if used as the masking material 46. To inhibit photoresist mask delamination, a 60 minute, 120° C. oven bake is performed in the absence of deep UV exposure, after the local interconnect dry etch and prior to the wet etch.

Although the dry etch is quite anisotropic to the titanium compound layer 43, the wet etch solution is isotropic and may slightly undercut layer 43 with respect to the masking material 46 slightly. Therefore, it is preferable to oversize the portion of patterned masking material 46 defining the local interconnect; for example, a local interconnect that is 0.8 of a micron wide may require a one micron wide pattern of masking material 46. Both the dry etch and the wet etch steps described herein are selective to the titanium compound layer 43 relative to dielectrics, and, therefore, the field oxide 12 and the sidewall oxides 26 and 38 remain substantially the same height as originally applied.

After the completion of the desired etching steps, patterned masking material 46 is removed by an appropriate method, such as a solvent resist strip for photoresist as masking material 46, as is well known in the art.

Figure 3:
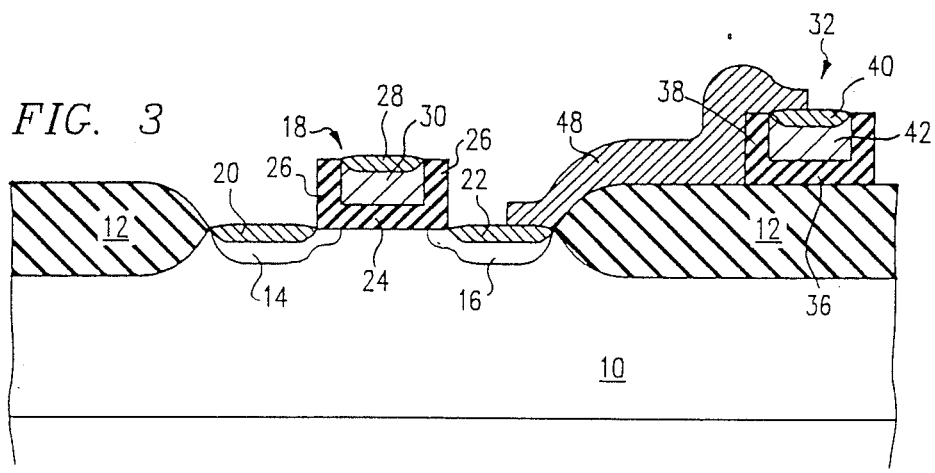
FIG. 3 is a cross-sectional view of an integrated circuit with a local interconnect formed in accordance with the present invention.

After the removal of masking material 46, the structure thus appears substantially as shown in FIG. 3, with local interconnect 48 exposed as the remaining portion of layer 43 after removing the masking material 46. The illustrated example of local interconnect 48 extends from drain region 16, contacting silicide film 22 thereat, to contact silicide film 40 located upon gate electrode 42. Local interconnects such as local interconnect 48 can also be used to contact diffused regions to one another, gate electrodes to one another, and also to provide a barrier metal to which contact vias may be etched in providing metal-to-diffusion and metal-to-polysilicon contacts. It should be noted that the compounds described herein for local interconnect 48, such as titanium nitride and titanium oxide, act substantially as a diffusion barrier to phosphorous, thereby allowing contact between phosphorous-doped n-type silicon and p-type silicon without the problem of outdiffusion of the n-type dopant through the interconnect 48 into the p-type doped semiconductor.

For improvement of the conductivity of silicide film 20, 22, 28 and 40, an anneal process is now performed on the wafer 44. The anneal process comprises any appropriate method such as sintering the wafer 44 in an oven at 700–800° C. for approximately 30 minutes. At this point, silicide film 20, 22, 28 and 40 have a change in sheet resistance of less than or equal to 0.3 ohms per square when compared to the sheet resistance of equivalent material that is not exposed to the dry etch.

The desired result of this method is a plasma etch of layer 43 with a high selectivity to the silicide film 20, 22, 28, and 40. In the example where layer 43 is primarily titanium nitride, and where silicide film 20, 22, 28 and 40 is titanium silicide, the result is an etch with a high TiN : TiSi$_2$ etch rate ratio. This high etch rate ratio is important to the performance of the circuit, as such performance depends, in part on the resistance of silicide film 20, 22, 28 and 40. Of course, the resistance of silicide film 20, 22, 28 and 40 is proportional to its thickness. For titanium silicide, overetch of titanium silicide film 20, 22, 28 and 40 by the plasma etch for forming local interconnect 48 increases this resistance, which is undesirable.

Specific examples of the results of various embodiments of the invention are provided hereinbelow. In a first example, the above described procedures with no introduced chlorine scavenging reagents, other than that provided by a graphite top powered electrode graphite was used. Wafer 44 had titanium silicide film 20, 22, 28 and 40, and titanium nitride layer 43. Photoresist was used as masking material 46.

The process conditions were:

| | |
|---|---|
| Carbon tetrachloride flow | 110 SCCM |
| He flow | 30 SCCM |
| Pressure | 350 millitorr |
| Power | 200 watts |
| Grounded electrode and wafer 44 temperature | 50° C. |
| Top powered electrode temperature | 25° C. |

The resultant etch rates produced were:

| | |
|---|---|
| Titanium nitride | 550 nm per minute |
| Titanium silicide | 80 nm per minute |
| Oxide | 30 nm per minute |

| | |
|---|---|
| -continued | |
| Photoresist | 20 nm per minute |

It can be seen that even without the additional chlorine scavenging reagent such as chloroform an etch rate of roughly 7 to 1 is achieved. Further testing with chloroform added has shown that a 20 to 1 etch rate of titanium nitride to titanium silicide is possible.

It should be noted that a higher powered electrode temperature (e.g., 50° C.) is preferred, so that polymerization on the powered electrode is minimized. Polymer formation on the powered electrode will reduce its chlorine scavenging ability.

Other tests have been conducted to verify the selectivity of the CCl$_4$ etch to titanium nitride relative to titanium silicide. These tests measured the amount of titanium silicide etched by measuring a change in sheet resistance of the silicide film. The delta in sheet resistance for a given etch time (pre-etch to post-etch) varies with the amount of TiSi$_2$ etched (i.e., the delta in thickness of the TiSi$_2$ film due to the etch). In the results of group A below, the chloroform flow rate was varied to determine the amount of TiSi$_2$ etched as a function of chloroform flow rate. In the results of group B below, the electrode material was changed, with no chloroform used, to determine the dependency of the TiSi$_2$ on the electrode material. In all examples, the etch time plus overetch time is the time required to clear TiN layer 43.

| A. Cholorform flow rate (SCCM) | Etch time (seconds) | Overetch time (seconds) | Change in sheet resistance (ohms/square) |
|---|---|---|---|
| 0 | 15 | 5 | 2.3 |
| 5 | 15 | 5 | 1.5 |
| 10 | 15 | 5 | 1.1 |
| 20 | 14 | 5 | 1.0 |
| B. Electrode Material | | | |
| Graphite | 17 | 6 | 2.0 |
| Anodized Aluminum | 21 | 5 | 8.3 |
| Titanium | 15 | 5 | 2.5 |

In an alternative embodiment, the titanium layer is covered with a silicon oxide or silicon nitride capping layer prior to the heating reaction to form titanium oxide (TiO) rather than titanium nitride. The silicon oxide layer is removed after reaction in a furnance with a nitrogen ambient at 650° C. The titanium oxide is also conductive and forms a local interconnect after being processed in the same fashion as the titanium nitride.

In this embodiment, the titanium oxide is etched with carbon tetrachloride using the same process as previously described above. Instead of forming CN or CN$_2$, however, carbon monoxide (CO) is formed, while all other reactions are essentially the same.

It has further been determined by experimentation that the plasma etching of titanium nitride as described above is selectively anisotropic, depending upon the mask material utilized to define the desired local interconnections. When the masking layer consists of a conventional organic photoresist, for example Novolak resins such as Shipley 1400 series and Shipley 1800 series photoresists, it has been observed that the etch of titanium nitride does not undercut the photoresist mask, and is thus quite anisotropic (i.e., etches in a vertical direction only), at those locations where the photoresist is protecting the titanium nitride interconnection. In contrast, at those locations where no photoresist is present (i.e., where no interconnect is desired), the etch of titanium nitride with carbon tetrachloride is substantially isotropic (i.e., etches at the same rate in all directions).

Figure 4A:
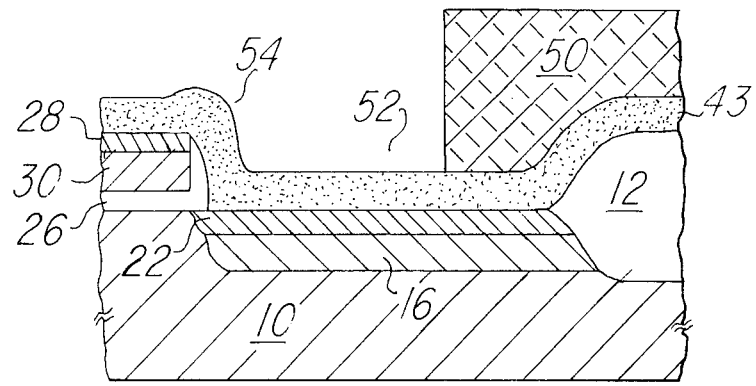
FIGS. 4a and 4b are cross-sectional views of an integrated circuit with a local interconnect formed according to an alternate embodiment of the invention.
Figure 4B:
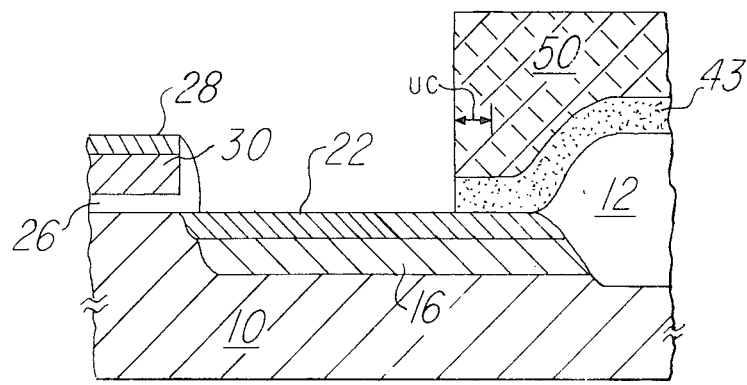

This selective anisotropy, depending upon the presence or absence of photoresist, provides for an etch which isotropically clears the filaments of titanium nitride, titanium oxide, or titanium oxynitride which previously required the performance of a wet etch to clear the filaments, without undercutting the photoresist mask as would occur if an isotropic etch were used to clear the filaments. Referring to FIGS. 4a through 4c, this phenomenon will be described.

FIG. 4a is a detailed view of a portion of the structure illustrated in FIGS. 1 through 3. As in the prior figures, layer 43 consists of a local interconnect material which is preferably substantially titanium nitride, but which may also contain titanium oxide mixed therein, or in the form of a titanium oxynitride, depending on the reaction conditions as described above. Layer 43 may have a thickness on the order of 40 nm over silicide film 22, and on the order of 100 nm over oxide, the difference in thicknesses due to consumption of the titanium during direct react silicidation. A masking layer 50 consisting of patterned and developed photoresist, preferably a Novolak resin such as a photoresist in the Shipley 1400 or 1800 series, is in place over layer 43 to define thereunder the desired local interconnect. In this case, the interconnect is desired to connect doped region 16, in this case clad with a silicide layer 22, to another conductive region (not shown) such as polysilicon or another diffusion, over field oxide structure 12. Gate electrode 30 consisting of polysilicon, clad with a silicide layer 28, is not to be connected to doped region 16, but instead may serve as the gate of a transistor having doped region 16 as a source or drain, as in the prior case.

As described hereinabove, the etch of titanium nitride using carbon tetrachloride is selectively anisotropic. Accordingly, it has been observed that continuation of the plasma etch beyond that required to clear layer 43 from the unmasked portions of silicide region 22 (e.g., location 52 of FIG. 4a) and from unmasked portions of field oxide 12 will not cause layer 43 to be etched from under the edge of masking layer 50, whether such an edge is located over silicide film 22 or over field oxide 12. However, at those locations where no photoresist is present, such as at location 54 of FIG. 4a where layer 43 makes a step (in this case, over sidewall oxide 26 at the edge of gate electrode 30), the etch is substantially isotropic. Steps such as at location 54 of FIG. 4a can create, where the etch is purely anisotropic, a filament of layer 43 which would (if not removed) connect gate electrode 30 to doped region 16.

According to the invention, however, upon and after clearing layer 43 from the surface of silicide film 22 and from the surface of field oxide 12 (not shown), no filament of titanium nitride (or titanium oxide, or titanium oxynitride) is present along the edges of steps such as along sidewall oxide 26, and undesired connections such as between gate electrode 30 and doped region 16 are avoided. The result of the etch is shown in FIG. 4b, where no filament is present, but where layer 43 has not been etched under masking layer 50. The dimension UC shown in FIG. 4b is the distance which would likely be undercut if a wet isotropic etch were used to remove a titanium nitride filament. For a thickness of layer 43 on the order of 100 nm, dimension UC would be approximately 100 nm; taking both sides of the connection together, the line width reduction resulting from wet clearing filaments would be on the order of 200 nm. For 1 micron feature sizes, a 200 nm line width loss would require 20% oversize of the patterned features. Such large oversizing limits the accuracy and repeatability of the manufacturing process for this etch, and the extent to which the features may be scaled.

Figure 5:
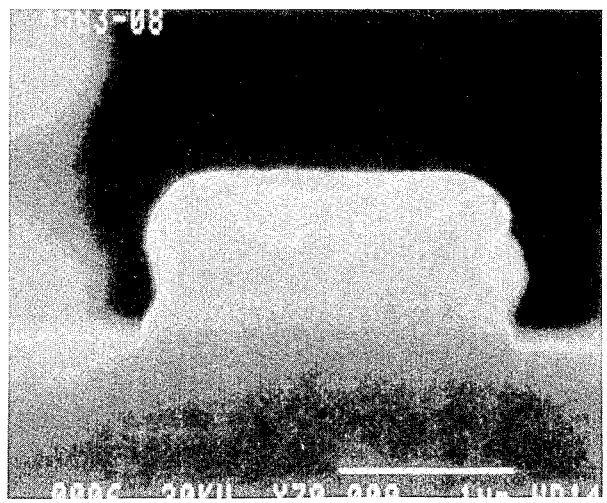
FIG. 5 is a cross-sectional SEM microphotograph illustrating the anisotropy of the etch described herein.

FIG. 5 is an SEM microphotograph illustrating the anisotropy of the titanium nitride etch, using a photoresist mask. The structure of FIG. 5 illustrates such an etch, in the case where the plasma etch using carbon tetrachloride was extended 200% after clearing of the titanium nitride from the silicide layer (i.e., the etch time was doubled after detection of the clearing of the silicide). After this overetch, the titanium nitride filaments were fully removed from the gate sidewalls (not shown), and as shown in FIG. 5, there was insignificant undercut of the titanium nitride under the photoresist mask. It should be noted that the selectivity of the chlorine-based etch both to the underlying silicide as well as to oxide and photoresist, as described hereinabove, is especially useful in removing the filaments, as the ability to overetch and thus take advantage of the selective anisotropy phenomenon could not be utilized if the material underlying the titanium interconnect compound (oxide, silicide, or another conductor) or if the photoresist mask (on the order of 600 nm thick over a 100 nm thick titanium nitride film) were also being etched by this etch.

As described above, a thin veneer consisting of some sort of residual material may yet remain on the sides of steps in the structure (e.g., the sides of sidewall oxide 26). The composition of such material is not yet well understood, but the material is very thin and quite conductive. Accordingly, a very brief wet etch may still be useful in some cases to remove this interfacial veneer; however, since filaments of the interconnect material itself can be removed by a plasma overetch according to the selective anisotropy described above, the interfacial layer may be removed by an extremely brief etch, with minimal line width reduction of layer 43. The selective anisotropy thus can reduce the duration of the wet interfacial layer strip and retain substantially the full line width of layer 43.

Although the present invention has been described with respect to a specific preferred embodiment thereof, various changes and modifications may be suggested to one skilled in the art, and it is intended that the present invention encompass such changes and modifications as fall within the scope of the appended claims.

I claim:

1. A method for forming a connection of a conductive titanium compound, over a dielectric and a conductor, on a semiconductor surface of a body, comprising:
   forming a layer comprising a conductive titanium compound in contact with said conductor and said dielectric, said layer of said conductive titanium compound disposed over a step near said surface;
   covering a portion of said conductive titanium compound with photoresist, said portion of said conductive titanium compound disposed over said step not covered by said photoresist; and
   exposing said body to a chlorine bearing agent in a plasma reactor to etch said conductive titanium compound from said conductor and said dielectric at locations not covered by said photoresist;

wherein said exposing step substantially removes said conductive titanium compound from the location of said step without substantially removing said conductive titanium compound from under said photoresist.

2. The method of claim 1, wherein the conductive titanium compound comprises titanium nitride.

3. The method of claim 2, wherein said conductive titanium compound further comprises titanium oxide.

4. The method of claim 1, wherein said conductive titanium compound comprises titanium oxynitride.

5. The method of claim 1, wherein said conductive titanium compound comprises titanium oxide.

6. The method of claim 1, further comprising:
mixing a chlorine scavenging reagent with the chlorine bearing agent in said flowing step.

7. The method of claim 1, wherein the chlorine bearing agent is carbon tetrachloride.

8. The method of claim 7, wherein the step of flowing further includes mixing an inert gas with said carbon tetrachloride.

9. The method of claim 1, wherein the step of igniting comprises passing radio frequency energy through said plasma etcher.

10. The method of claim 9, wherein the step of igniting further includes shining ultraviolet light through said plasma etcher.

11. The method of claim 1, wherein the conductor comprises a refractory metal.

12. The method of claim 11, wherein the conductor comprises a refractory metal other than titanium.

13. The method of claim 12, wherein the conductor comprises molybdenum.

14. The method of claim 12, wherein the conductor comprises tungsten.

15. The method of claim 1, wherein the conductor comprises silicon.

16. The method of claim 15, wherein the conductor comprises a silicide compound.

17. The method of claim 16, wherein the silicide compound is cobalt silicide.

18. A method for forming a local interconnect at a silicon surface, comprising the steps of:
forming an insulating layer over a selected location of said surface;
forming an interconnect layer of material comprising titanium in contact with a conductor near said silicon surface and said insulating layer;
covering a portion of said interconnect layer with a masking layer to define an interconnect; and
etching said interconnect layer with a chlorine bearing agent in a plasma reactor to remove portions of said interconnect layer not covered by said masking layer.

19. The method of claim 18, wherein the step of forming said interconnect layer comprises:
depositing a layer of titanium over said conductor, said insulating layer, and in contact with a location of said silicon surface;
reacting said titanium in a nitrogen and argon ambient at a temperature sufficient to cause the titanium layer to react with said silicon surface to form a layer of titanium silicide covered with a layer of titanium nitride, and to form a layer of titanium nitride over said insulating layer.

20. The method of claim 18, wherein the step of forming said interconnect layer comprises:
depositing a layer of titanium nitride over said conductor and said insulating layer.

21. The method of claim 18, wherein the step of etching comprises plasma etching with carbon tetrachloride.

22. The method of claim 21, wherein the step of etching further includes mixing a chlorine scavenging reagent with said carbon tetrachloride.

23. The method of claim 18, wherein the conductor comprises a refractory metal.

24. The method of claim 23, wherein the conductor comprises a refractory metal other than titanium.

25. The method of claim 24, wherein the conductor comprises molybdenum.

26. The method of claim 24, wherein the conductor comprises tungsten.

27. The method of claim 18, wherein the conductor comprises silicon.

28. The method of claim 27, wherein the conductor comprises a silicide compound.

29. The method of claim 28, wherein the silicide compound is cobalt silicide.

* * * * *